(12) United States Patent
Sasaki et al.

(10) Patent No.: US 6,985,096 B1
(45) Date of Patent: Jan. 10, 2006

(54) BIMODAL SERIAL TO PARALLEL CONVERTER WITH BITSLIP CONTROLLER

(75) Inventors: Paul T. Sasaki, Sunnyvale, CA (US); Jason R. Bergendahl, Sunnyvale, CA (US); Atul Ghia, San Jose, CA (US); Jian Tan, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/919,900

(22) Filed: Aug. 17, 2004

(51) Int. Cl.
*H03M 9/00* (2006.01)

(52) U.S. Cl. ...................... 341/100; 341/101

(58) Field of Classification Search ............. 341/100, 341/101, 53; 714/810; 710/71
See application file for complete search history.

(56) References Cited

U.S. PATENT DOCUMENTS

| | | | | |
|---|---|---|---|---|
| 3,750,021 A | * | 7/1973 | Lender | 714/810 |
| 3,823,397 A | * | 7/1974 | Howard et al. | 341/53 |
| 3,863,226 A | * | 1/1975 | Ryburn | 710/71 |
| 5,144,304 A | * | 9/1992 | McMahon et al. | 341/58 |
| 6,696,995 B1 | * | 2/2004 | Foley et al. | 341/100 |
| 6,724,328 B1 | * | 4/2004 | Lui et al. | 341/101 |
| 6,816,095 B1 | * | 11/2004 | Yokoyama et al. | 341/101 |

OTHER PUBLICATIONS

Altera, Corp., "QDR SRAM Controller Reference Design for Stratix and Stratix GS Devices", Application Note 211, Nov. 2002, pp. 1-30, v. 2.0, available from Altera Corporation, 2610 Orchard Parkway, San Jose, California 95134-2020.

Altera, Corp., "The Benefits of Altera's High-Speed DDR SDRAM memory Interface Solution", White Paper, May 2004, pp. 1-16, v. 1.1 available from Altera Corporation, 2610 Orchard Parkway, San Jose, California 95134-2020.

Altera, Corp., "DDR SSRAM Controller MegaCore User Guide", Feb. 2003, pp. 1-89, Core Version 1.1.0, Document Version 1.1.0 rev 1, available from Altera Corporation, 2610 Orchard Parkway, San Jose, California 95134-2020.

Altera, Corp., "Using High-Speed Differential I/O Interfaces in Stratix Devices", Application Note 202, Jan. 2003, pp. 1-72, v. 2.1, available from Altera Corporation, 2610 Orchard Parkway, San Jose, California 95134-2020.

Altera, Corp., "Using Source-Synchronous Signaling with DPA in Stratix GX Devices", Application Note 236, Nov. 2002, pp. 1-18, v. 1.0, available from Altera Corporation, 2610 Orchard Parkway, San Jose, California 95134-2020.

(Continued)

*Primary Examiner*—Jean Bruner Jeanglaude
(74) *Attorney, Agent, or Firm*—W. Eric Webostad; Justin Liu

(57) ABSTRACT

Method and apparatus for a bimodal serial to parallel converter is provided. A first stage of registers is clocked responsive to a clock signal, such as a forwarded clock signal of a synchronous interface. The first stage of registers is configurable in either a single serial shift chain or two serial shift chains. The former configuration is for Single Data Rate ("SDR") data, and the latter configuration is for Double Data Rate ("DDR") data. A bitslip controller is configured to provide a control select signal to selection circuitry. For DDR operation, the control signal is for selecting respective portions of outputs from the two serial shift chains for providing to a second stage of registers. For DDR operation, the second stage of registers is alternatively clocked responsive to a divided down version of the clock signal and another divided down version of the clock signal which is periodically stopped.

31 Claims, 9 Drawing Sheets

OTHER PUBLICATIONS

Altera, Corp., "Section 1. Device Pine Information", Jul. 2003, Ch. 1-7, pp. 1-1 to 7-84, v. 2.0, available from Altera Corporation, 2610 Orchard Parkway, San Jose, California 95134-2020.

Altera, Corp., "Section II. Memory", Apr. 2004, Ch. 2-3, pp. II-1 to 3-28, v. 3.0, available from Altera Corporation, 2610 Orchard Parkway, San Jose, California 95134-2020.

Altera, Corp., "Section III. I/O Standards", Apr. 2004, Ch. 4-5, pp. III-1 to 5-76, v. 3.0, available from Altera Corporation, 2610 Orchard Parkway, San Jose, California 95134-2020.

Altera, Corp., "Section VI. Configuration & Remote System Upgrades", Apr. 2004, Ch. 11-12, pp. VI-1 to 12-44, available from Altera Corporation, 2610 Orchard Parkway, San Jose, California 95134-2020.

Altera, Corp., "2. TriMatrix Embedded Memory Blocks in Stratix & Stratix GX Devices", Apr. 2004, pp. 2-1 to 2-28, v. 3.0, available from Altera Corporation, 2610 Orchard Parkway, San Jose, California 95134-2020.

Altera, Corp., "3. External Memory Interfaces", Apr. 2004, pp. 3-1 to 3-28, v. 3.0, available from Altera Corporation, 2610 Orchard Parkway, San Jose, California 95134-2020.

Altera, Corp., "4. Selectable I/O Standards in Stratix & Stratix GX Devices", Apr. 2004, pp. 4-1 to 4-42, vol. 2, v. 3.0, available from Altera Corporation, 2610 Orchard Parkway, San Jose, California 95134-2020.

Altera, Corp., "5. High-Speed Differential I/O Interfaces in Stratix Devices", Apr. 2004, pp. 5-1 to 5-76, vol. 2, v. 3.0, available from Altera Corporation, 2610 Orchard Parkway, San Jose, California 95134-2020.

Altera, Corp., "Section I. Clock Management", Apr. 2004, pp. 1-1 to 1-58, vol. 2, v. 3.0, available from Altera Corporation, 2610 Orchard Parkway, San Jose, California 95134-2020.

Altera, Corp., "Section I. Stratix Device Family Data Sheet", Apr. 2004, Ch. 1-5, pp. 1-1 to 5-2 vol. 1, available from Altera Corporation, 2610 Orchard Parkway, San Jose, California 95134-2020.

Altera, Corp., "Section II. PCB Layout Guidelines", Apr. 2003, Ch. 8-10, pp. II-1 to 10-58, vol. 1, available from Altera Corporation, 2610 Orchard Parkway, San Jose, California 95134-2020.

U.S. Appl. No. 10/889,553, filed Jul. 12, 2004, Zhang et al.
U.S. Appl. No. 10/889,248, filed Jul. 12, 2004, Zhang et al.
U.S. Appl. No. 10/919,766, filed Aug. 17, 2004, Sasaki et al.
U.S. Appl. No. 10/919,901, filed Aug. 17, 2004, Sasaki et al.

* cited by examiner

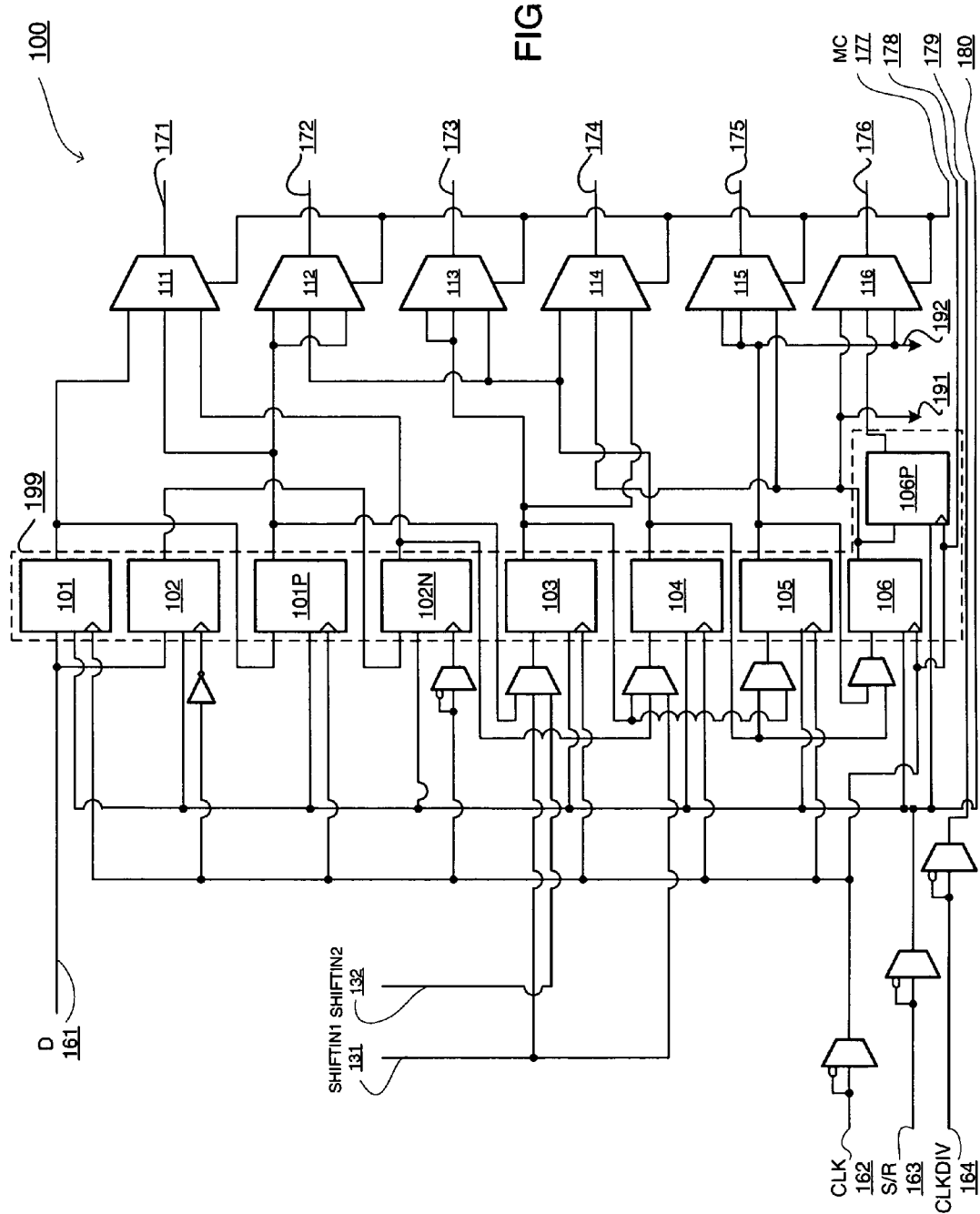

BIMODAL SERIAL TO PARALLEL CONVERTER WITH BITSLIP CONTROLLER

FIELD OF THE INVENTION

One or more aspects of the invention relate generally to serial to parallel conversion and more particularly, to selective control of re-ordering digital data ("bitslip") during serial to parallel conversion.

BACKGROUND OF THE INVENTION

Digital communication of information from a source to a receiver may be done source synchronously. Source synchronous communication involves a clock signal from the source ("forwarded clock signal") being sent in parallel with other information from the source. Such other information may include data or control information, where control information may include address information.

There are different types of source synchronous communication, which depends on the application. For example, for source synchronous communication with synchronous memory, frequency of a source clock signal is known by a receiving device, and sent data tends to be relatively closely associated with the source clock signal. However, for example in source synchronous communication in networking or telecommunication, frequency of a source clock signal may not be known by the receiving device. Furthermore, due to differences in signal propagation delays, there may be skew between information communicated in parallel with the source clock signal. Accordingly, received serial information converted to parallel information may be out of order. The operation or operations to put such digital data back into order or otherwise re-order the digital data is referred to as "bitslip."

For some networking and telecommunication standards, a "training pattern" is used to initialize a link. The training pattern is a repetitive pattern that is sent that allows a receiver to achieve "data alignment" and "lane alignment". The exact same training pattern is sent across all "lanes". A lane is defined as a single data line from the transmitter to the receiver. The data line can be single ended or differential. The exact number of data lines is dependent on the implementation. Generally, the number of data lines is a multiple of two.

Data alignment is the process where each individual receiver on a data line aligns the data that is received to the forwarded clock. For example, a receiver may use a delay element to center the data in the middle of the forwarded clock. This process allows the receiver to know that it is taking in valid data. Each receiver works independently from the other receivers. Once data alignment has been achieved, the lane alignment begins.

Lane alignment uses a bitslip function along with the training pattern. For example, suppose a training pattern is the six-character sequence of ABCDEF, where ABCDEF represent a sequence of 6 binary digits. Lane alignment is the procedure where each individual lane aligns its output so that an output sequence of ABCDEF is obtained from each such lane. If a receiver does not output the sequence of ABCDEF, the bitslip function is used to "shift" the pattern output until the training pattern, in this example ABCDEF, is obtained. In this example, there are six possible combinations of ABCDEF that a receiver may receive, where each bit is the first of a sequence (e.g., DEFABC). Using the bitslip function enough times, lane alignment is achieved when the output pattern is the training pattern, which in this example is ABCDEF.

A receiver may receive data in serial and provide data in parallel. However, output of such parallel data is to conform to the training sequence. A conventional bitslip circuit converts the parallel data to serial data with induced clock latency, and then reorders ("bitslips") the converted serial data.

Accordingly, it would be desirable and useful to provide a bitslip circuit capable of directly reordering parallel data.

SUMMARY OF THE INVENTION

An aspect of the invention is a bimodal serial to parallel converter, including: a first stage of registers clocked responsive to a first signal; first select circuitry coupled to the first stage of registers; a second stage of registers coupled to the select circuitry and clocked responsive a second signal; a third stage of registers clocked responsive to a third signal; the third signal having a lower frequency than the first signal; a first portion of the first stage of registers configured as a single shift register chain in a first mode of operation; a second portion of the first stage of registers configured as two shift registers in a second mode of operation; a bitslip controller coupled to receive the first signal and the third signal and configured to provide a clock control signal and a input select control signal; the first select circuitry coupled to receive the input select control signal and to select responsive to the input select control signal between at least two outputs of the first stage of registers to provide parallel input to the second stage of registers; second select circuitry coupled to receive the third signal and the clock control signal and configured to provide the second signal as being either one of the third signal and the clock control signal; the clock control signal being a divided down version of the first signal; the clock control signal being the second signal when in the second mode of operation; and the third signal being the second signal when in the first mode of operation.

Another aspect of the invention is a method for reordering data, including: obtaining serial data to a first stage of registers, the first stage of register apportioned into a first chain of registers and a second chain of registers; converting the serial data to parallel data with the first stage of registers responsive to a first clock signal; the serial data serially shifted into the first chain of registers on a positive edge of the first clock signal; the serial data serially shifted into the second chain of registers on a negative edge of the first clock signal; selecting a first portion of output of the first chain of registers and the second chain of registers to provide a first bitslip operation in a first direction; the selecting responsive to a control signal in a first state; and selecting a second portion of output of the first chain of registers and the second chain of registers to provide a second bitslip operation in a second direction; the selecting responsive to the control signal in a second state.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIGS. 1A and 1B in combination are a block/schematic diagram depicting an exemplary embodiment of a serial to parallel converter.

DETAILED DESCRIPTION OF THE DRAWINGS

Figure 1B:
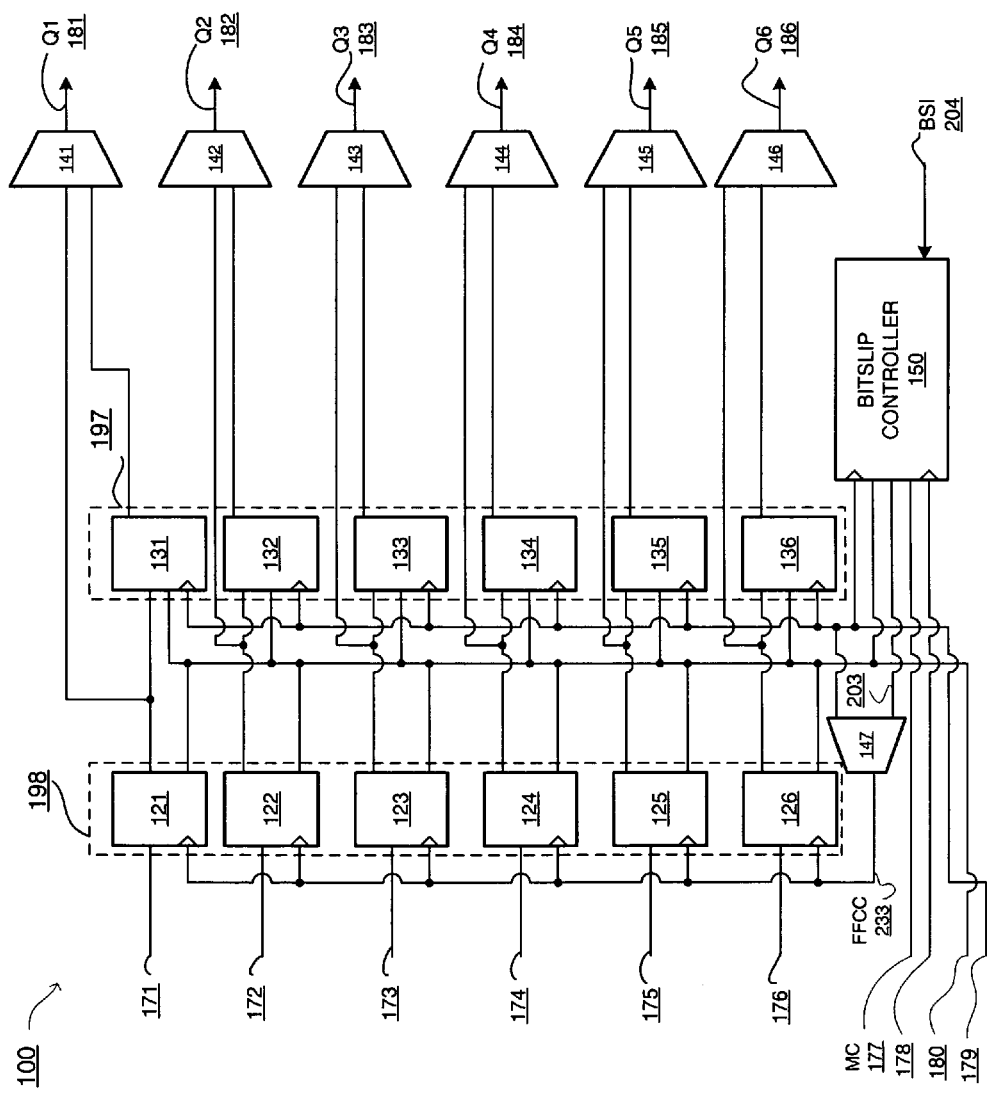

FIG. 1A is a block/schematic diagram depicting an exemplary embodiment of a portion of a serial to parallel converter 100. A serial data signal 161 is provided to registers 101 and 102 of a first stage ("stage 1") 199 of registers, namely, registers 101, 102, 101P, 102N, 103, 104, 105, 106 and 106P. Other inputs to serial to parallel converter 100 include a clock signal 162, a set/reset signal 163 and a divided clock signal 164. Frequency of clock signal 162 may be associated with a frequency of a forwarded clock signal provided with serial data signal 161 of a source synchronous interface.

Other inputs to serial to parallel converter 100 may include shift input carry signals 131 and 132 from a primary input/output ("IO") cell, such as an input/output block ("IOB") of a programmable logic device ("PLD"). Examples of PLDs include Field Programmable Gate Arrays ("FPGAs"), and complex PLDs ("CPLD"). However, any configurable IO or IOB of any integrated circuit may be used.

Reference numbers 171 through 180 are used in this example for associating the portion of serial to parallel converter 100 illustratively shown in FIG. 1A with another portion of the exemplary embodiment of serial to parallel converter 100 which is depicted in the block/schematic diagram of FIG. 1B. In FIG. 1B, included with serial to parallel converter 100 is a bitslip controller 150. Serial to parallel converter 100 is further described with simultaneous reference to FIGS. 1A and 1B.

It should be understood that there are three stages of registers. The second stage ("stage 2") 198 of registers is registers 121 through 126, and the third stage ("stage 3") 197 of registers is registers 131 through 136. It should be understood that both Single Data Rate ("SDR") and Double Data Rate ("DDR") types of data for data signal 161 may be converted with serial to parallel converter 100. Furthermore, it should be appreciated that serial to parallel converter 100 may be used with or without bitslipping.

Outputs from stage 1 registers are provided as inputs to multiplexers 111 through 116 disposed between stage 1 and stage 2 registers. Outputs of multiplexers 111 through 116 are respectively provided as inputs to stage 2 registers. Outputs of stage 2 registers are respectively provided as inputs to stage 3 registers. Outputs of stage 2 and stage 3 registers are respectively provided as pairs of inputs to multiplexers 141 through 146. For example, output of stage 1 register 101 is provided as an input to multiplexer 111; the output of multiplexer 111 is provided as an input to stage 2 register 121; the output of stage 2 register 121 is provided as an input to stage 3 register 131 and to output multiplexer 141; and the output of stage 3 register 131 is provided as another input to output multiplexer 141. Accordingly, there is a one-to-one correspondence between outputs of multiplexers 111 through 116 and inputs to stage 2 registers. There is a one-to-one correspondence between outputs of stage 2 registers and inputs to stage 3 registers. There is a one-to-one correspondence between outputs of stage 2 registers and one input of output multiplexers 141 through 146, and there is a one-to-one correspondence between outputs of stage 3 registers and another input of output multiplexers 141 through 146. Notably, there is not a one-to-one correspondence between outputs of stage 1 registers and inputs to interim stage multiplexers 111 through 116.

Stage 1 registers are clocked responsive to clock signal 162. Stage 3 registers are clocked responsive to divided clock signal 164, which is a frequency divided version of clock signal 162. Thus, clock signal 162 is at a higher frequency than divided clock signal 164.

Outputs of registers 105 and 106 are shift output carry signals that may be provided to a secondary IOB. Stage 2 registers are clocked responsive to an output from multiplexer 147, and the inputs to multiplexer 147 are divided clock signal 164 and a bitslip clock signal 203. Divided clock signal 164 and bitslip clock signal 203 have the same frequency. Divider ratios of divided clock signal 164 and bitslip clock signal 203 are programmed to provide a serial to parallel conversion ratio. For purposes of clarity, output of multiplexer 147 is referred to hereinafter as flip-flop clock control ("FFCC") signal 233.

Data from serial data signal 161 is loaded into stage 1 registers 101 through 106 responsive to clock signal 162. Data from stage 1 registers is loaded into stage 2 registers responsive to FFCC signal 233. For example, for a serial to parallel conversion of one serial stream of data to six parallel streams of data, divided clock signal 164 and FFCC signal 233 toggle once for each six clock cycles of clock signal 162. For the sixth cycle of clock signal 162, data from stage 1 registers is loaded into stage 2 registers 121 through 126. Data from stage 2 registers is respectively loaded into stage 3 registers 131 through 136 responsive to divided clock signal 164, namely, a data transfer from the bitslip clock domain to the divided clock domain.

Thus, for SDR operation: output from register 101 is provided as input to registers 101P and 121; output from register 101P is provided as input to registers 103 and 122; output from register 103 is provided as input to registers 104 and 123; output from register 104 is provided as input to registers 105 and 124; output from register 105 is provided as input to registers 106 and 125; and output from register 106 is provided as input to register 126. Notably, outputs of stage 1 registers are coupled to stage 2 registers via multiplexers 111 through 116. Shift output ports 191 and 192 are for stacking serial to parallel converters 100, which is described in additional detail in a co-pending U.S. patent application entitled "Multi-Purpose Source Synchronous Interface Circuitry" by Sasaki et al., filed on the date hereof, which is incorporated herein in its entirety.

For SDR operation, all registers of serial to parallel converter 100 may initially be set or reset via set/reset signal 163. These registers include registers of bitslip controller 150, though not all set/reset signal lines are shown for purposes of clarity. A divider, which may be implemented as a counter 300 and depicted on FIGS. 2A and 2B, of bitslip controller 150 is stopped for a single clock cycle of clock signal 162 for SDR operation, as described below in additional detail. The divider is used to generate bitslip clock signal 203.

Stage 1 registers are configured as a serial shift register chain using the sequence of registers 101 ("Flip-flop 1"), 101P ("Flip-flop 2"), 103 ("Flip-flop 3"), 104 ("Flip-flop 4"), 105 ("Flip-flop 5"), and 106 ("Flip-flop 6"). Though registers 102, 102N and 106P are present, their outputs are not used.

For SDR operation, multiplexer control output 177 of bitslip controller 150 is programmed, for example to 0, such that only one input to the multiplexers is valid. Thus, the output of Flip-flop 1 goes to Flip-flop 2 and register 121, the output of Flip-flop 2 goes to Flip-flop 3 and register 122, the output of Flip-flop 3 goes to Flip-flop 4 and register 123, the output of Flip-flop 4 goes to Flip-flop 5 and register 124, the output of Flip-flop 5 goes to Flip-flop 6 and register 125 and the output of Flip-flop 6 goes to register 126. Thus, multiplexers 111 through 116 are used to selectively pass data from stage 1 registers to stage 2 registers for SDR operation.

Continuing the above example, suppose the sequence of ABCDEF is applied at data input 161, the transfer of data takes place as follows: on a rising edge of clock signal 162, Flip-flop 1 would clock in A. On the next rising edge of clock signal 162, A would now be clocked into Flip-flop 2 and Flip-flop 1 would take in B. On the next rising edge of clock signal 162, A would now be clocked into Flip-flop 3, B would be clocked into Flip-flop 2 and C would be clocked into Flip-flop 1. This will continue until A is contained in Flip-flop 6, B is contained in Flip-flop 5, C is contained in Flip-flop 4, D is contained in Flip-flop 3, E is contained in Flip-flop 2 and F is contained in Flip-flop 1. On the next clock pulse of clock signal 162, outputs Q1 to Q6 of registers 121 to 126, respectively, hold the sequence of FEDCBA, and Flip-flops 1, 2, 3, 4, 5, and 6 contain the sequence of AFEDCB. Again, it should be noted that the FFCC output signal 203 of bitslip controller 150 generates a clock that is a divided version of clock signal 162. The divisor is dependent on the programming which is application dependent. For an SDR application with the 6-bit sequence of ABCDEF, the divisor is six. This means FFCC output signal 203 is ⅙ that of clock signal 162. This allows a serial to parallel transfer of data between stage 1 and stage 2 flip-flops. In this example, there are six possible combinations of outputs Q1 through Q6 (via multiplexers 141–146) of registers 121 through 126, respectively, where bits are shifted one position over for each clock cycle. The six possible combinations in sequence are listed in Table I.

TABLE I

| Output | SEQ 1 | SEQ 2 | SEQ 3 | SEQ 4 | SEQ 5 | SEQ 6 |
|--------|-------|-------|-------|-------|-------|-------|
| Q1 | F | E | D | C | B | A |
| Q2 | A | F | E | D | C | B |
| Q3 | B | A | F | E | D | C |
| Q4 | C | B | A | F | E | D |
| Q5 | D | C | B | A | F | E |
| Q6 | E | D | C | B | A | F |

Figure 2A:
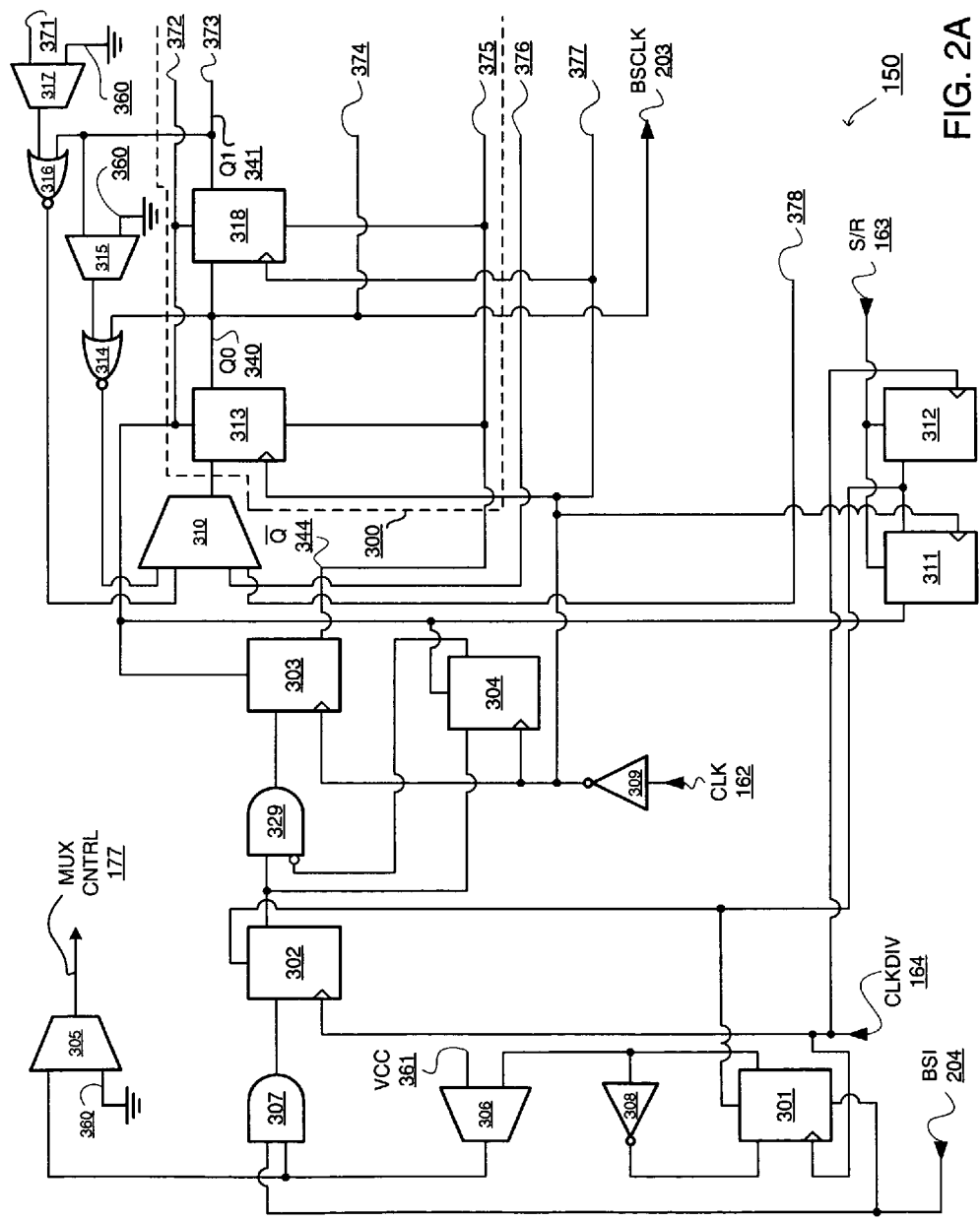
FIGS. 2A and 2B in combination are a schematic diagram depicting an exemplary embodiment of bitslip controller.
Figure 2B:
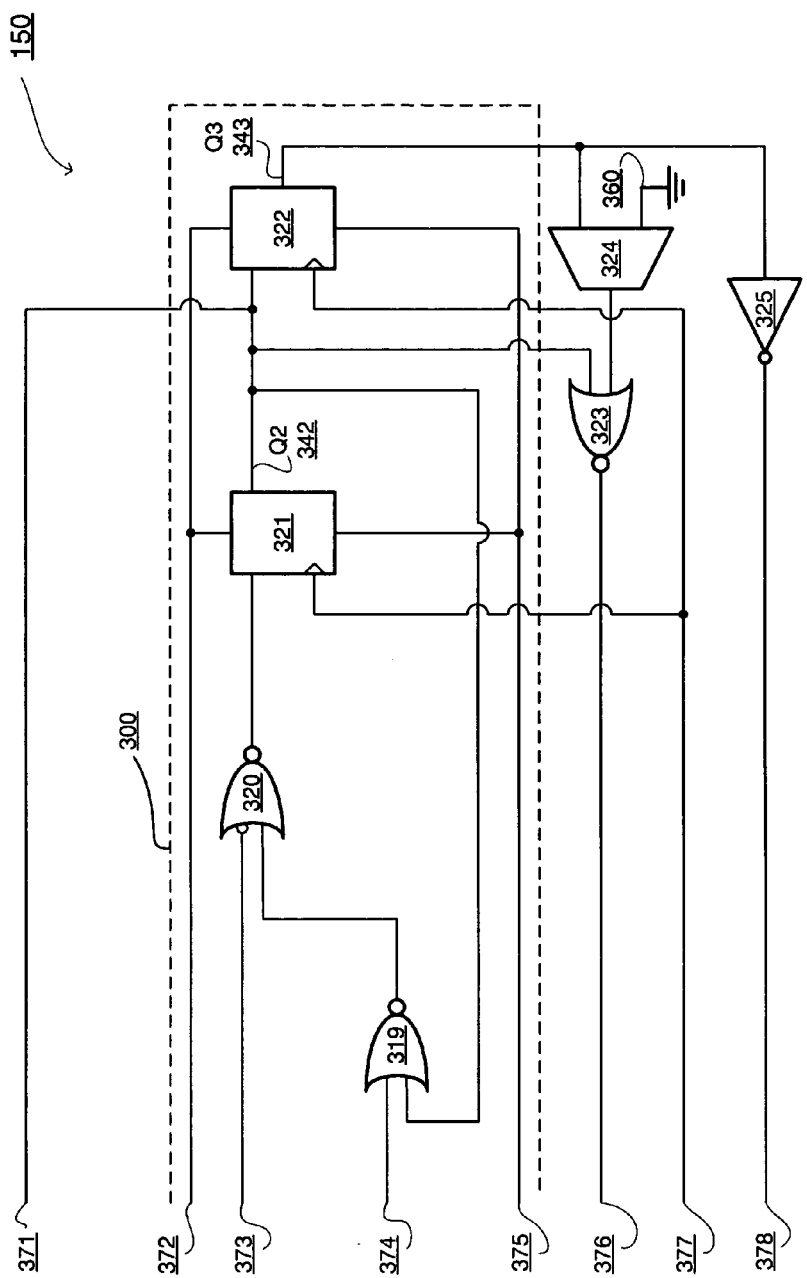

FIGS. 2A and 2B in combination are a schematic diagram depicting an exemplary embodiment of bitslip controller 150. In this embodiment, bitslip controller 150 may provide divider ratios of 2, 3, 4, 5, 6, 7, and 8. However, more divider ratios may be obtained by increasing the chain length of registers of counter 300. With continuing reference to FIGS. 2A and 2B and renewed reference to FIGS. 1A and 1B, serial to parallel converter 100, including bitslip controller 150, is further described.

Clock signal 162 is provided to an inverter 309 as input. Output of inverter 309 is provided to registers 303, 304, 311, 313, 318, 321 and 322 as input. Divided clock signal 164 is provided to registers 301, 302 and 312 as clock input. A bitslip input signal 204 is provided in parallel to register 301 as a clock enable input and to an AND gate 307 as input. An output of AND gate 307 is provided to register 302 as data input. Another input of AND gate 307 is connected to an output of a multiplexer 306. One input of multiplexer 306 is coupled to supply voltage 361 and another input of multiplexer 306 is coupled to an output of register 301. Output of register 301 is also inverted by inverter 308 and provided to as data input to register 301, thereby forming a toggle function. An output of register 302 is provided to an input of AND gate 329. An output of register 304 is provided to an inverter for second input to AND gate 329.

Output of AND gate 329 is provided to register 303 as data input. An inverted output signal $\overline{Q}$ 344 from register 303 is provided to registers 313, 318, 321 and 322 as a clock enable signal. Output of register 311 is coupled to registers 303, 304, 313, 318, 321 and 322 as a reset signal. A signal Q0 340 from register 313 is provided to register 318 as data input, provided as an input to NOR gate 319 and to NOR gate 314, and provided as bitslip clock signal 203. A signal Q1 341 from register 318 is provided to an inverter for input to NOR gate 320 and as an input to NOR gate 316 and a data input to multiplexer 315. A signal Q2 342 from register 321 is provided as an input to NOR gate 319 and to a NOR gate 323, to multiplexer 317 and to register 322 as data input. A signal Q3 343 from register 322 is provided as a data input to a multiplexer 324 and to an inverter 325. An output of multiplexer 324 is provided to a NOR gate 323 as input.

An output of inverter 325 is provided to a multiplexer 310 as data input. An output of NOR gate 323 is provided to multiplexer 310 as data input. An output of NOR gate 314 is provided to multiplexer 310 as data input. An output of NOR gate 316 is provided to multiplexer 310 as data input.

Set/reset signal 163 is provided to registers 311 and 312 to process set or reset functions as described above. Supply voltage input 361 may be provided as input to multiplexer 306. Output of multiplexer 306 may be provided as data input to multiplexer 305 and AND gate 307. A common ground voltage input 360 may be provided to multiplexers 324, 317, 315 and 305. Output of multiplexer 315 is provided to NOR gate 314 as input. Output of multiplexer 317 is provided to NOR gate 316 as input. Output of multiplexer 324 is provided to NOR gate 323 as input. NOR gates 314, 316 and 323 are respectively coupled to outputs of registers 313, 318 and 321 to receive output signals Q0 340, Q1 341 and Q2 342, respectively.

Optionally for SDR operation, output of multiplexer 306 may be programmed to be a logic one via a supply voltage input 361 and output of multiplexer 305 may be programmed to be a logic zero via a ground input 360. Raising bitslip input 204 to bitslip controller 150 to a logic high state for only one clock cycle of divided clock signal 164 activates bitslip operation. Setting bitslip input 204 to a logic high state for only one clock cycle of divided clock signal 164 raises output of register 302, clocked by divided clock signal 164, to a logic high state for one clock cycle of divided clock signal 164.

Output of register 302, clocked responsive to divided clock signal 164, drives output of register 303, clocked responsive to clock signal 162, to a logic low state for one clock cycle of clock signal 162. Output of register 304, clocked responsive to clock signal 162, is coupled to input of register 303 to ensure that output of register 303 is at a logic low state for only one clock cycle of clock signal 162. Clock enable input 375 is driven from an inverted output port of register 303 as inverted output signal $\overline{Q}$ 344 and is provided to a counter 300. Counter 300 is formed in part of registers 313, 318, 321, and 322. Counter 300 counts at least in partial response to inverted output signal $\overline{Q}$ 344 from register 303 being at a logic high state.

For SDR, responsive to a bitslip function being activated, counter 300 is stopped. Stopping counter 300 for a single clock cycle of the high-speed clock signal 162, causes counter 300 to take an extra clock cycle of clock signal 162 to generate a pulse of FFCC signal 233. Continuing the above example of a divide by six conversion, seven clock cycles of clock signal 162 are used instead of six clock cycles thereof to generate a low speed clock pulse of FFCC signal 233. Delaying data transfer for a single clock cycle of clock signal 162 allows stage 1 registers, clocked responsive to clock signal 162, to shift the data stored therein forward one extra register. This extra shift causes cyclic rotation of data.

For example, suppose output from registers 121 through 126 respectively is FEDCBA and the bitslip function is activated once. The results of activating bitslip once is that registers 313, 318, 321 and 322 of counter 300 are stopped from counting for a single cycle of clock signal 162. Holding counter 300 for one clock cycle means that it will take seven cycles rather than the above-mentioned six cycles before bitslip controller 150 generates a clock pulse as bitslip clock signal 203 for FFCC signal 233. If only six clock pulses were used, then data transfer from Flip-flops 1, 2, 3, 4, 5 and 6 to outputs Q1, Q2, Q3, Q4, Q5 and Q6 is at the exact same point every time.

However, an extra clock cycle is what provides shifting of bits. Recall in the example that the content of Flip-flops 1, 2, 3, 4, 5 and 6 was FEDCBA at the moment of transfer, also recall on the next cycle these contents changed to AFEDCB. The delay of the single clock pulse will change the output from FEDCBA to AFEDCB. If the bitslip function is not activated again, the counter will be back to generating a FFCC signal every $6^{th}$ clock and keep the output stable. In looking back at the 6 possible output combinations for this example, it may be seen from Table I that the output has changed from Q1 to Q2. If the bitslip function is invoked once again, the output will move from Q2 to Q3. By invoking a bitslip operation three additional times, all six possible combinations of input sequences may be observed. However, a user may stop invoking bitslip operations once a desired sequence is observed.

DDR Operation

For DDR operation, two shift register chains, instead of one shift register chain as for SDR, are used. For example, data entered on a rising edge of clock signal 162 pulses may be provided to one shift register chain, such as registers 101, 101P, 103, and 105 of stage 1 registers, and data entered on a falling edge of clock signal 162 pulses may be provided to another shift register chain, such as registers 102, 102N, 104, 106, and 106P of stage 1 registers.

For DDR operation, in this example, the bottom two inputs to each of multiplexers 111 through 116 are used for data transfer. Multiplexer control output signal 177 from bitslip controller 150 is provided as a control signal input to each of multiplexers 111 through 116 to select which of the bottom two inputs of each of multiplexers 111 through 116 is selected for data transfer output.

Initially, all registers of serial to parallel converter 100 may be set using set/reset signal 163. Multiplexers 306 and 305 are used to provide multiplexer control signal 177. Multiplexer control signal 177 may be a logic low to select the bottom input of each of multiplexers 111 through 116 for data transfer output. For the bottom input of each of multiplexers 111 through 116 selected for data transfer, data is transferred from stage 1 registers to stage 2 registers as follows: data from register 101P is transferred to register 122; data from register 102N is transferred to register 121; data from register 103 is transferred to register 124; data from register 104 is transferred to register 123, data from register 105 is transferred to register 126, and data from register 106 is transferred to register 125.

As there are two shift register chains, data is moved from stage 1 registers to stage 2 registers responsive to clock signal 162. For example, for a six bit wide serial to parallel conversion, data is transferred from stage 1 registers to stage 2 registers every third clock cycle of clock signal 162. Accordingly, dividers, e.g., counter 300, are set to three for this embodiment. For DDR operation, dividers are set to one-half the value used for SDR operation. So for example, for a six-bit wide serial to parallel conversion for SDR, data is transferred every sixth clock cycle of clock signal 162 and thus dividers are set to six. However, for a six-bit wide serial to parallel conversion for DDR, data is transferred every third clock cycle of clock signal 162 and thus dividers are set to three. Of course, other data widths, and thus other divider settings, may be used.

For an initial setting of registers of serial to parallel converter 100 for DDR operation, data from register 101P is transferred to output Q2 182. Data from register 102N is transferred to output Q1 181. Data from register 103 is transferred to output Q4 184. Data from register 104 is transferred to output Q3 183. Data from register 105 is transferred to output Q6 186. And, data from register 106 is transferred to output Q5 185.

An initial bitslip operation may be invoked by holding bitslip input signal 204 at a logic high state for only one clock cycle of divided clock signal 164.

Register 301 output, provided responsive to divided clock signal 164, starts at a logic low level and is driven to a logic high level by divided clock signal 164. Output from register 301 propagates through multiplexers 306 and 305 causing multiplexer control signal 177 to transition from a logic zero level to a logic one level. An initial state of register 301 maintains register 302 output at a logic low level to block use of registers 303 and 304.

Responsive to multiplexer control signal 177 going to a logic high state, the select input to multiplexers 111 through 116 changes. Accordingly, data propagation changes too, such that: data from register 101P propagates to output Q1 181, data from register 103 propagates to output Q3 183, data from register 104 propagates to output Q2 182, data from register 105 propagates to output Q5 185, data from register 106 propagates to output Q4 184, and data from register 106P propagates to output Q6 186. Notably, stage 1 register 102N at this time does not propagate data to any output, and thus this implements a first shifting of bits. This shifting of bits is done while simultaneously doing a parallel to serial conversion.

Continuing the above example of a six-bit wide conversion, suppose that a repetitive pattern is stored such that B A F E D C respectively appears at outputs Q1 181 through Q6 186. Accordingly, stage 1 registers 101, 102, 101P, 102N, 103, 104, 105, 106, and 106P respectively hold states C D A B E F C D and B at data transfer. Invoking a bitslip operation changes the pattern in registers 121 through 126 to A F E D C B, respectively. Thus, the pattern in this example has been shifted one bit to the left. In other words, all values move one position to the left and state B ends up in the Q6 position.

The second time bitslip input 204 is held high, the operation is the same as previously described for SDR though with different results. Register 301 output goes from a logic high state to a logic low state, which causes multiplexer control signal 177 to transition from a logic high state to a logic low state. Multiplexer control signal 177 in a logic low state causes multiplexers 111 through 116 to return to an initial state, namely, selecting the bottom most input to multiplexers 111 through 116 for data transfer.

Register 301 allows register 302 output to transition to a logic high state, which in turn causes the combination of registers 303 and 304 to hold counter 300 for one clock cycle of clock signal 162. Accordingly, in the above example, it will now take four more clock cycles of clock signal 162 before stage 2 registers 121 through 126 are clocked again. This means that data in the chain of shift registers formed by stage 1 registers will move one position from their original position. Notably, until assertion of bitslip input 204 for the second time, stage 1 registers will not have changed their value at the time of data transfer. However, after assertion of bitslip input 204 for the second time, stage 1 registers change which in turn changes an output pattern. Continuing the above example, the output pattern would change to D C B A F E. This output pattern shows the effect of two serial shift registers. The original pattern of B A F E D C has been shifted two bits to the right.

Notably, the first bitslip operation only changed control select inputs to multiplexers 111 through 116, and did not change the values in stage 1 registers at the time of data transfer. For a two-bit shift to the right, all bits move two positions to the right, and states D and C move to the front of the pattern.

Figure 3:
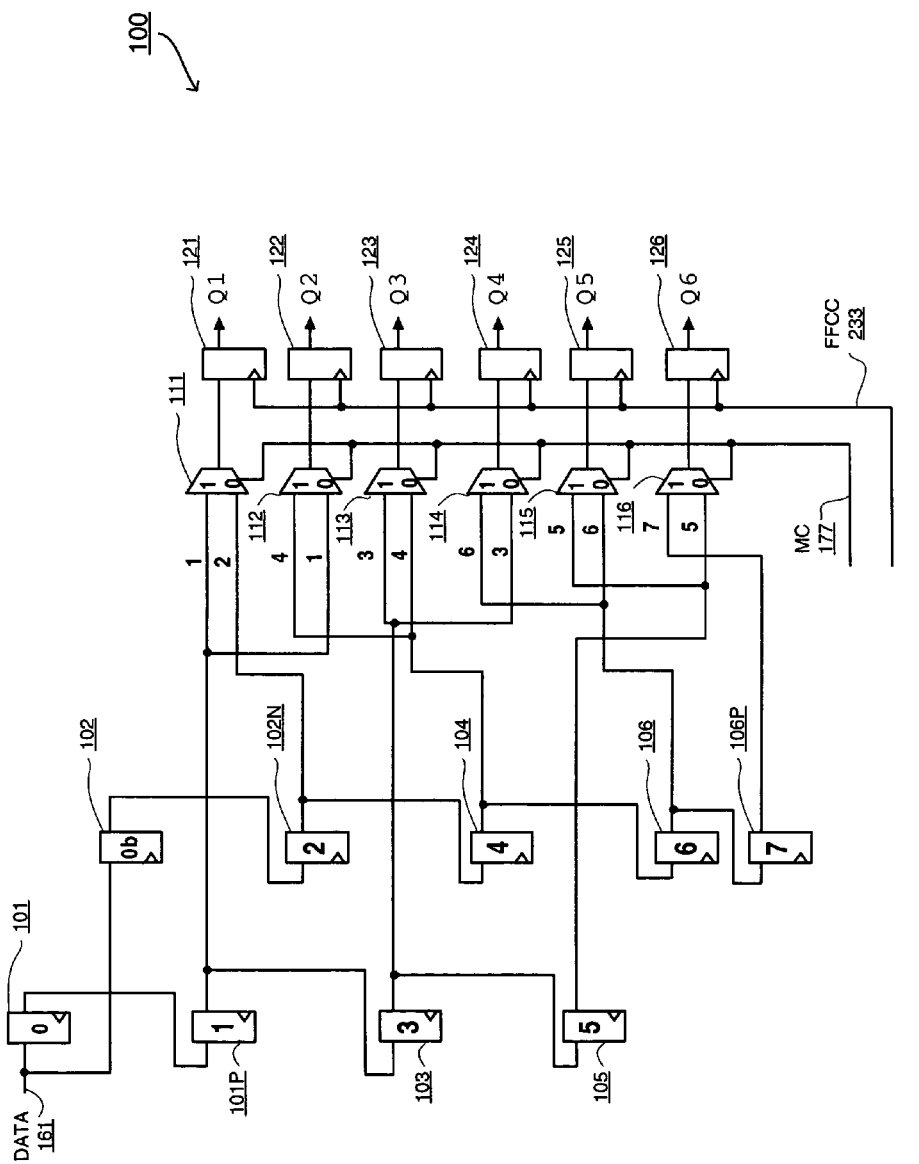
FIG. 3 is a redrawn version of a portion of serial to parallel converter of FIGS. 1A and 1B with reduced complexity.

For purposes of clarity by way of example, FIG. 3 is a redrawn version of a portion of serial to parallel converter 100 of FIGS. 1A and 1B with reduced complexity. To emphasize the fact that the data takes two paths, serial to parallel converter 100 has been redrawn with registers 101, 101P, 103, and 105 in one column and with registers 102, 102N, 104, 106, and 106P in another column. Registers 101, 101P, 103, and 105 have been respectively labeled 0, 1, 3, and 5, and registers 102, 102N, 104, 106, and 106P have been respectively labeled 0b, 2, 4, 6, and 7.

Output 1 from register 101P is provided to a logic high input for multiplexer 111 and to a logic low input for multiplexer 112. Output 2 from register 102N is provided to a logic low input for multiplexer 111. Output 3 from register 103 is provided to a logic high input for multiplexer 113 and to a logic low input for multiplexer 114. Output 4 from register 104 is provided to a logic high input for multiplexer 112 and to a logic low input for multiplexer 113. Output 5 from register 105 is provided to a logic high input for multiplexer 115 and to a logic low input for multiplexer 116. Output 6 from register 106 is provided to a logic high input for multiplexer 114 and to a logic low input for multiplexer 115. Output 7 from register 106P is provided to a logic high input for multiplexer 116.

Data from data signal 161 on a rising edge of clock signal 162 enters register 0. Data from data signal 161 on a negative edge of clock signal 162 enters register 0b. Registers 0, 1, 3 and 5 create a serial shift chain, and registers 0b, 2, 4, 6 and 7 create a separate serial shift chain.

Continuing the example of a 6-bit sequence of ABCDEF. Initially, A is clocked in on a positive edge of clock signal 162 into register 0, and B is clocked into register 0b on a negative edge of clock signal 162. Then, C is clocked into register 0 on a positive edge of clock signal 162, and D is clocked into register 0b on a negative edge of clock signal 162. On the next full clock cycle, E is clocked into register 0 on a positive edge of clock signal 162, and F is clocked into register 0b on a negative edge of clock signal 162. Accordingly, at this point, registers 0, 1, 3 and 5 respectively contain the pattern AECA, and registers 0b, 2, 4, 6 and 7 respectively contain the pattern BFDBF.

For DDR operation, the multiplexers in front of registers 121 through 126 are used and controlled by multiplexer control signal ("MC") 177 output from bitslip controller 150. In this embodiment, bitslip controller 150 generates a clock pulse once every 3 cycles for FFCC signal 233. The pulse is generated once every 3 cycles because there are two separate shift register chains for DDR operation. This is in contrast to SDR operation that uses a single shift register chain. For DDR operation, FFCC signal 233 is generated twice as often to compensate for the two chains.

Initially, MC signal 177 is logic 0, which means that registers 121 through 126 contain the outputs of registers 2, 1, 4, 3, 6 and 5, respectively. Inserting the values for these registers, it should be understood that Q1 through Q6 will have an output pattern of FEDCBA. It may appear that inputs to multiplexers 111 through 116 are swapped to compensate for the two separate shift chains.

Before bitslipping is invoked, registers 0, 1, 3 and 5 contain the pattern AECA and registers 0b, 2, 4, 6 and 7 contain the pattern BFDBF. The first time bitslip is invoked, MC signal 177 output from bitslip controller 150 changes from a logic level 0 to a logic level 1. This changes the data inputs that feed registers 121 through 126 for respective outputs Q1 to Q6. Notably, neither contents of registers 0 though 7 nor the frequency of the clock pulse generated for FFCC signal 233 have changed. Rather, different outputs of multiplexers 111 through 116 are selected. For example, register 1 output is propagated to Q1; register 4 output is propagated to Q2; register 3 output is propagated to Q3; register 6 output is propagated to Q4; register 5 output is propagated to Q5; and register 7 output is propagated to Q6. Thus, selected outputs from inputs to multiplexers 111 through 116 have essentially shifted up one.

Before invoking bitslipping, register 2 output was propagated to Q1; register 1 output was propagated to Q2; register 4 output was propagated to Q3; register 3 output was propagated to Q4; register 6 output was propagated to Q5; and register 5 output was propagated to Q6. Since register 2's output is not provided at a logic high input of a multiplexer of multiplexers 111 through 116, register 7 is employed as a substitute. Accordingly, registers 2 and 7 contain the same data. When MC signal 177 changes its value, register 7 output propagates to Q6. Continuing the example, after all multiplexer output selections have changed, the output at Q1 to Q6 is EDCBAF. In looking at the combinations, it may be seen that we are now at combination Q6 in Table I. In essence, changing settings has moved us back one position from Q1 to Q6. Alternatively, rather than including register 7, register 7 may be omitted and the output of register 2 may be tied to the logic 1 port of multiplexer 116.

The second time bitslipping is invoked, bitslip controller 150 performs two operations. Bitslip controller 150 not only changes MC signal 177 from logic level 1 back to logic level 0, bitslip controller 150 also delays counter 300 one clock cycle of clock signal 162. Since counter 300 is set to 3, it will now take 4 cycles of clock signal 162 before FFCC signal 233 generates another clock pulse. Notably, clock signal 162 and divided clock signal 164 may be distributed using global clock resources of an FPGA. Notably, global clock resources are shared by multiple IOBs. In order for each IOB configured for bitslip to operate independently from other IOBs configured for bitslip operations, a third clock cycle was provided. Bitslip controller 150 generates the third clock cycle, though other circuitry may be used. Accordingly, bitslip clock signal 203 is generated with a circuit that is the same as the circuit that generated divided clock signal 164. As bitslip clock signal 203 is generated internally to an IOB, it may be manipulated without affecting performance of other IOBs. This may be advantageous as each serial stream of incoming data may not need the same number of bitslip operations performed in order to re-order the digital data received, and thus having bitslip operations from IOB to IOB be independent of one another facilitates accommodating differences in re-ordering digital data.

Recall that before a clock pulse appears at FFCC signal 233, registers 0, 1, 3 and 5 contain the pattern AECA and registers 0b, 2, 4, 6 and 7 contain the pattern BFDBF. After one more cycle of clock signal 162, the contents of registers 0, 1, 3 and 5 will now respectively contain the pattern CAEC and registers 0b, 2, 4, 6 and 7 respectively contain the pattern DBFDB. MC signal 177 will have changed from logic level 1 back to logic level 0 responsive to a clock pulse from FFCC signal 233, and thus the Q1 to Q6 outputs will respectively be BAFEDC. Referring to Table I, it may be seen that the output has moved form output Q6 to output Q3. Unlike SDR operation moving one position at a time, for DDR operation the output has moved three combinations rather than one.

In other words, because there are two shift chains for DDR operation, two patterns are moved at a time rather than one. The two shift chains in a DDR operational mode shift two bits in one single cycle of clock signal 162, rather that one bit per clock cycle for an SDR operational mode. Because clock stoppage shifts two combinations rather than one, only half of the patterns or combinations are covered by stopping counter 300. Changing selected outputs of multiplexers 111 through 116 cause an upward movement of one pattern by reverting back to an original setting.

Summing up the example so far, we started at combination Q1, moved to combination Q6 then to combination Q3. The third time a bitslip operation is invoked, MC signal 177 changes from logic level 0 back to logic level 1. Recall, just prior to this change in MC signal level, registers 0, 1, 3 and 5 contain the pattern CAEC and registers 0b, 2, 4, 6 and 7 contain the pattern DBFDB. Responsive to MC signal 177 changing from logic level 0 to logic level 1 changes the settings of multiplexers 111 through 116. In other words, the settings of multiplexers 111 through 116 are brought back to where they were previously for the first bitslip operation. This for the example means that outputs Q1 to Q6 will be AFEDCB or output Q2. In essence, changing multiplexer 111 through 116 settings has again moved the combination output back one position.

To recap, starting from output Q1, the first bitslip operation caused the output to move back one position to output Q6. The second bitslip operation cause the output to move forward three positions to output Q3, namely, from Q6 the output moved forward passed outputs Q1 and Q2 to output Q3. The third bitslip operation caused the output to move back one position to output Q2. Thus, a pattern of back one position and forward three positions is emerging.

The fourth time a bitslip operation is invoked, bitslip controller 150 again performs the above-described double operation. Multiplexers settings are again changed from logic level 1 back to logic level 0, and the count of counter 300 is again stopped for one clock cycle of clock signal 162 thereby changing the contents of registers 0 through 7. Registers 0, 1, 3 and 5 will now contain the pattern ECAE, and registers 0b, 2, 4, 6 and 7 will now contain the pattern FDBFD. This means that the Q0 to Q6 outputs will now be DCBAFE. In looking at Table I, it may be seen that the output is combination Q5. As before, the output has moved 3 combinations, namely, from Q2 to Q5.

The fifth time a bitslip operation is invoked, only the MC signal 177 is changed from logic level 0 back to logic level 1. This changes routing settings of multiplexers 111 through 116 such that a different set of inputs are propagated to registers 121 through 126, respectively. The contents of registers 0 to 7 have not changed for this operation. Registers 0, 1, 3 and 5 contain the pattern ECAE, and registers 0b, 2, 4, 6 and 7 contain the pattern FDBFD. This means that outputs Q0 to Q6 respectively are CBAFE, which is combination output Q4. As before, this bitslip operation has moved the output back one position, namely, from output Q5 to output Q4 in Table I.

To confirm return to the start, the sixth time a bitslip operation is invoked, bitslip controller 150 again performs the above-described double operation. MC signal 177 is changed from logic level 1 back to logic level 0, which is its original position, and counter 300 is stopped for one clock cycle of clock signal 162. This stoppage of counter 300 changes the contents of registers 0 to 7. Registers 0, 1, 3 and 5 now contain the pattern AECA, and registers 0b, 2, 4, 6 and 7 now contain the pattern BFDBF. This means that outputs q0 to q6 are now respectively FEDCBA or combination output Q1 from Table I.

In summary, bitslip controller 150 moves position of output combinations back one combination on one bitslip iteration and forward three combinations on the immediately preceding bitslip iteration. Though in the above example, bitslip operations were invoked six times, in practice a user may apply bitslipping at most five times to obtain all possible outcomes for a 6-bit combination as the sixth iteration results in a redundant position or outcome.

Accordingly, it should be appreciated that a bimodal serial to parallel converter has been described that may be used for SDR and DDR serial data. Moreover, a serial to parallel converter that may be used for various forms of source synchronous interfacing, such as to a synchronous integrated circuit or to a network interface, may be used. In particular with respect to a network interface, parallel data may be bitslipped, in contrast to conventional bitslipping of serial data. Additionally, it should be appreciated that clock speed for DDR operation may be lowered by use of a serial to parallel converter and bitslip may be employed where all combinations of outcomes may be obtained.

Figure 4:
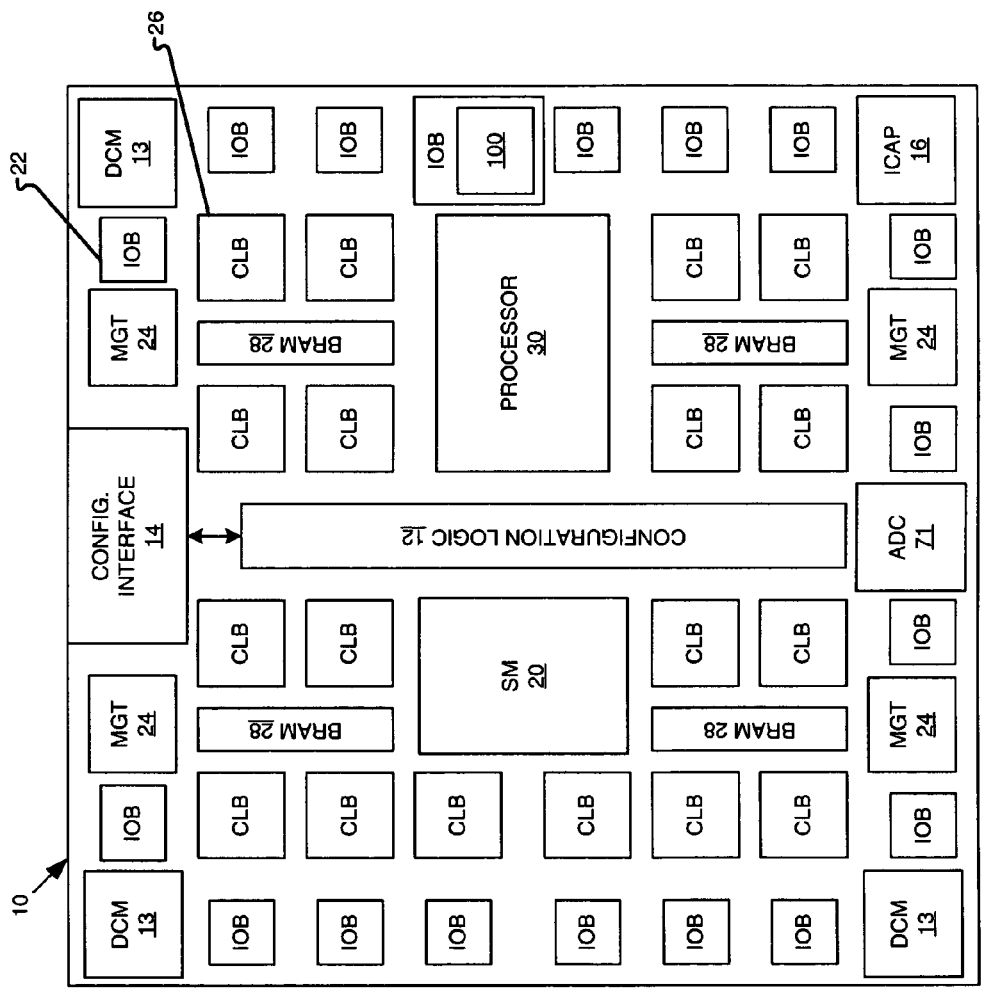
FIG. 4 is a high-level block diagram depicting an exemplary embodiment of a Field Programmable Gate Array ("FPGA") with a "ring" architecture.

FIG. 4 is a high-level block diagram depicting an exemplary embodiment of a Field Programmable Gate Array ("FPGA") 10. FPGA 10 is an example of a software configurable integrated circuit. However, other programmable devices such as programmable logic devices ("PLDs") other than FPGAs, including complex PLDs ("CPLDs"), and other integrated circuits with configurable logic, may be used.

FPGA 10 may include various resources such as configurable logic blocks ("CLBs") 26, programmable input/ output blocks ("IOBs") 22, memory, such as block random access memory 28, delay lock loops (DLLs) and multiply/divide/de-skew clock circuits which collectively provide digital clock managers ("DCMs") 13, and multi-gigabit transceivers ("MGTs") 24. An external memory may be coupled to FPGA 10 to store and provide a configuration bitstream to configure FPGA 10, namely, to program one or more configuration memory cells to configure CLBs 26, IOBs 22, and other resources. Notably, IOBs 22, as well as MGTs 24, may be disposed in a ring or ring-like architecture forming a perimeter of I/Os around CLBs 26 of FPGA 10 in some embodiments, although other configurations are possible.

Additionally, FPGA 10 may include an Internal Configuration Access Port ("ICAP") 16, an embedded processor 30, an embedded system monitor 20 with an Analog-to-Digital Converter ("ADC"), and an embedded second ADC 40. Though FPGA 10 is illustratively shown with a single embedded processor 30, FPGA 10 may include more than one processor 30. Additionally, known support circuitry for interfacing with embedded processor 30 may be included in FPGA 10. Furthermore, rather than an embedded processor 30, processor 30 may be programmed into configurable logic such as a "soft" processor 30.

Although FIG. 4 illustratively shows a relatively small number of IOBs 22, CLBs 26 and BRAMs 28, for purposes of example, it should be understood that an FPGA 10 conventionally includes many more of these elements. Additionally, FPGA 10 includes other elements, such as a programmable interconnect structure and a configuration memory array, which are not illustratively shown in FIG. 4.

FPGA 10 is configured in response to a configuration information (commands and data) bitstream, which is loaded into a configuration memory array of FPGA 10 from an external memory, e.g., a read-only memory ("ROM"), via configuration interface 14 and configuration logic 12. Configuration interface 14 can be, for example, a select map interface, a Joint Test Action Group ("JTAG") interface, or a master serial interface. Alternatively, with respect to external configuration or reconfiguration, FPGA 10 may be internally reconfigured through use of ICAP 16 or a dynamic reconfiguration port. A dynamic reconfiguration port is described in additional detail in a co-pending U.S. patent application Ser. No. 10/837,331, entitled "Reconfiguration Port for Dynamic Reconfiguration", by Vadi et al., filed Apr. 30, 2004, which is incorporated by reference herein in its entirety.

With renewed reference to FIG. 4, configuration memory may include columns of memory cells, where each column includes a plurality of bits. Configuration data is conventionally divided out into data frames. Configuration data may be loaded into the configuration memory array one frame at a time via configuration interface 14 or ICAP 16, or in sub-frame increments via a dynamic reconfiguration port.

Figure 5A:
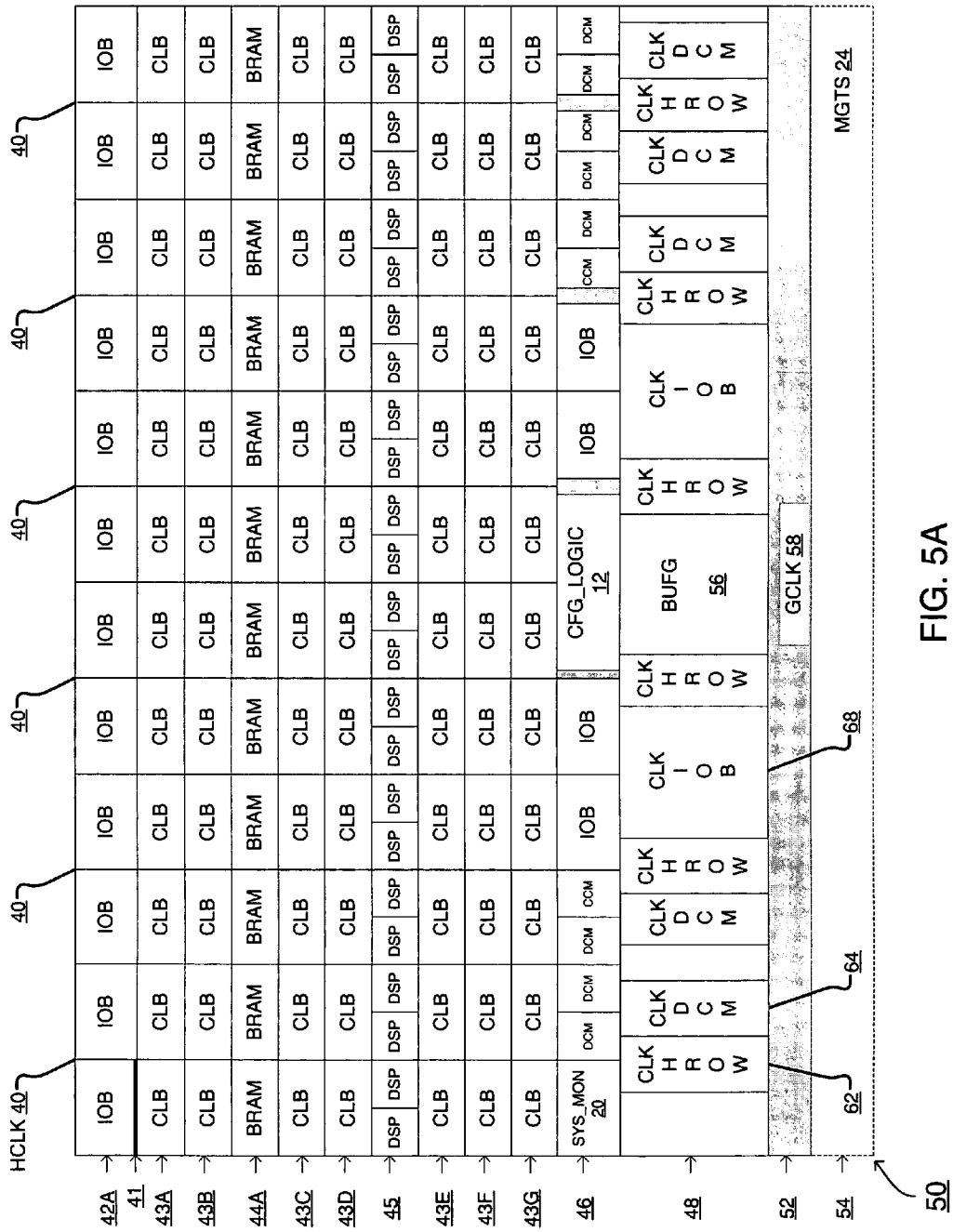
FIGS. 5A and 5B are high-level block diagrams depicting an exemplary embodiment of an FPGA with a "columnar" architecture.
Figure 5B:
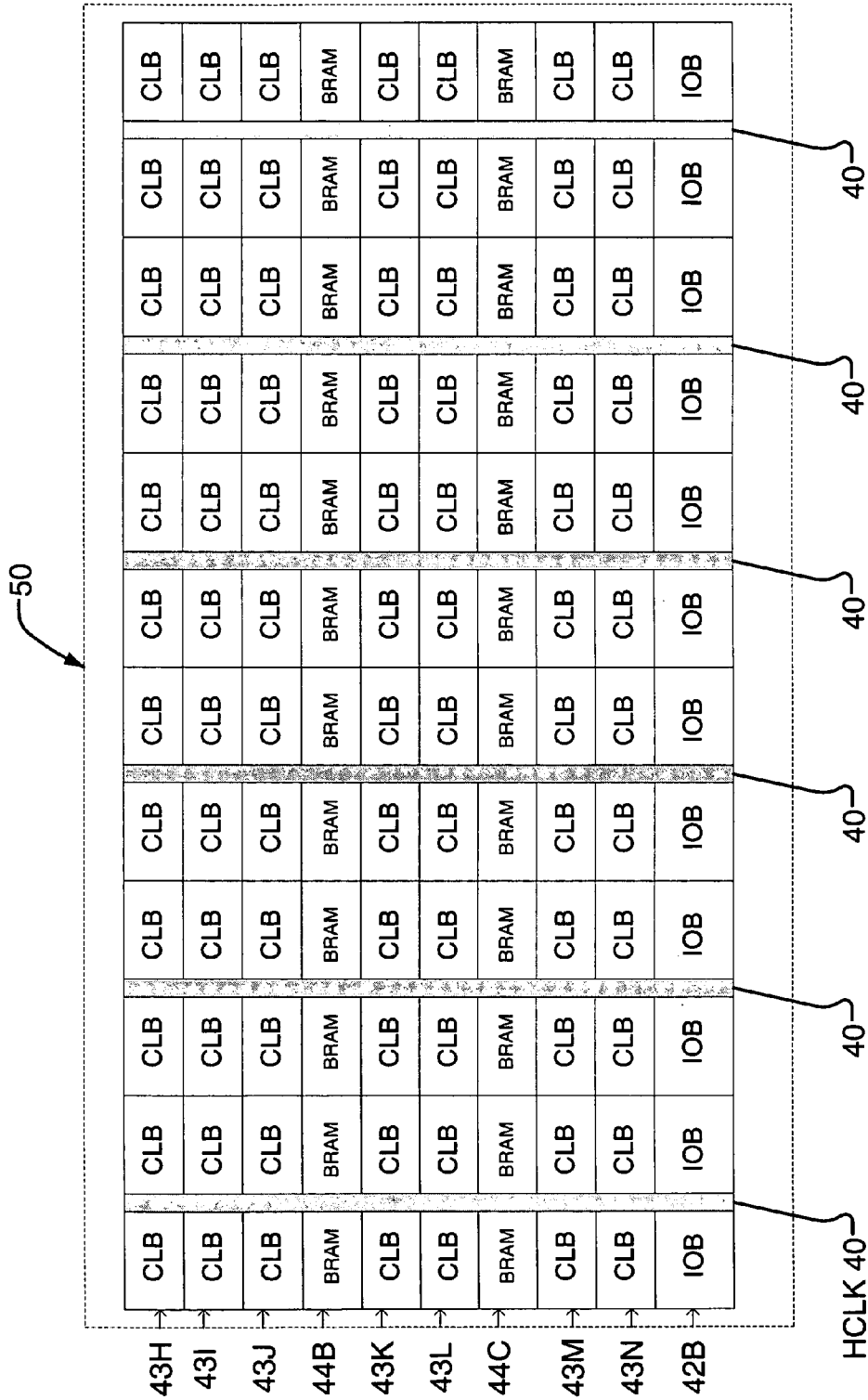

FIGS. 5A and 5B are high-level block diagrams depicting an exemplary embodiment of an FPGA 50 with a "columnar" architecture. FIG. 5A illustratively shows a top portion of FPGA 50, and FIG. 5B is the bottom portion of FPGA 50.

Figure 5C:
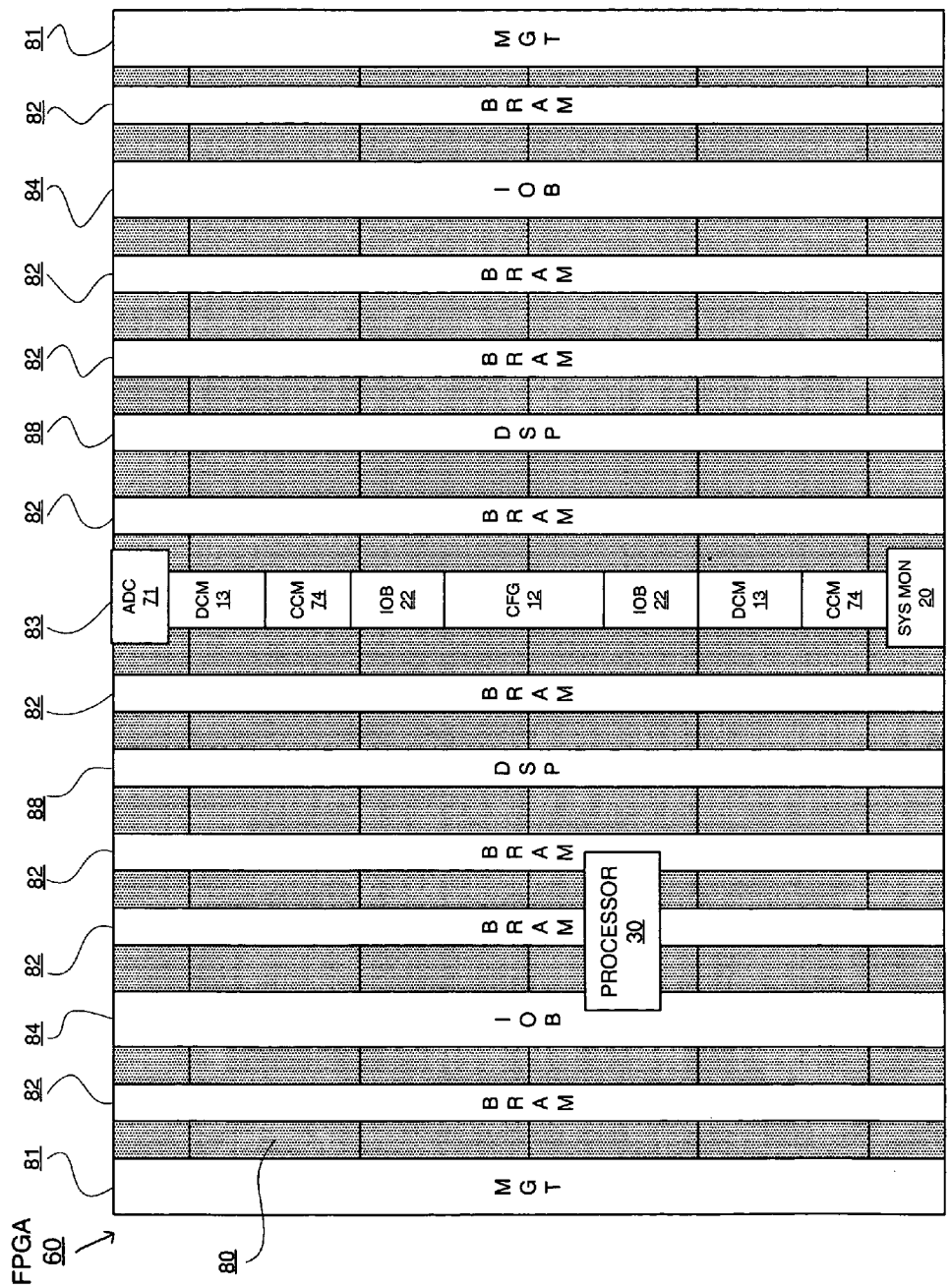
FIG. 5C is a high-level block diagram depicting another exemplary embodiment of an FPGA with a "columnar" architecture and with an embedded processor.

FIG. 5C is a high-level block diagram depicting another exemplary embodiment of an FPGA 60 with a "columnar" architecture and with an embedded processor 30. A column of MGTs 81 may be disposed on opposite sides of FPGA 60. Programmable fabric 80, which may include CLBs and programmable interconnects, may be used to respectively couple columns of MGTs 81 to columns of BRAMs 82. Programmable fabric 80 may be used to couple columns of BRAMs 82 to one another and to columns of IOBs 84. This inward progression on two opposing sides of FGPA 60 of coupling columns may continue until a center or central column 83 is reached.

Center column 83 may be coupled to columns of BRAMs 82 via programmable fabric 80. Center column 83 may include function logic blocks. Function logic blocks may, for example, include a system monitor 20 ("SYS MON"), digital clock managers 13 ("DCMs"), clock companion modules 74 ("CCMs"), configuration logic 12 ("CFG"), and IOBs 22, among other function logic blocks. Notably, not all function blocks have to be located in center column 83. For example, Digital Signal Processors ("DSPs") may be instantiated in columns of DSPs 88, which are coupled to columns of BRAMS 82 via programmable fabric 80. Alternatively, one or more DSPs may be included in center column 83.

System monitor 20 may include an analog-to-digital converter ("ADC") to monitor parameters like temperature and voltage both internally ("on-chip") and externally ("off-chip") with respect to FPGA 60. Another ADC 71 may be instantiated in center column 83 of FPGA 60 to monitor additional external analog channels. A DCM 13 may include circuits to perform clock de-skew, clock phase shifting, clock frequency synthesis, and other clock features. A CCM 74 may include circuits for phase-matched binary clock division and internal clock jitter and skew measurement.

Configuration logic 12 includes logic used to address and load configuration information into configuration memory cells, such as SRAM-based configuration memory cells, during external configuration of FPGA 60. Configuration logic 12 may include configuration registers, boundary scan test circuitry, such as JTAG circuitry, and encryption or decryption circuitry used to encrypt or decrypt bitstreams of configuration data loaded into or read out of FPGA 60.

Additional details regarding FPGA 60 may be found in a co-pending U.S. patent application Ser. No. 10/683,944 entitled "Columnar Architecture", by Young, filed Oct. 10, 2003, assigned to the same assignee, which is incorporated by reference herein in its entirety.

FIGS. 5A and 5B in combination provides a more detailed block diagram of an FPGA 50 having a columnar architecture, though columns have been transposed for rows. The word "tile" as used herein is an area comprising a) circuitry with one or more programmable functions, including memory, or fixed non-programmable circuitry, and b) programmable interconnections.

CLB tiles 43 are laid out in a two-dimensional array. In this example, each CLB tile 43 includes a portion of a programmable interconnect structure such that at least part of the programmable interconnect structure for FPGA 50 is formed by the various portions of the many CLBs when CLB tiles 43 are formed together for FPGA 50. Also illustrated are block random memory/multiplier (BRAM/Multiplier) tiles 44.

In order to provide input/output circuitry for interfacing FPGA 50 to external logic, IOB tiles 42 are provided along two outermost rows (e.g., top and bottom rows) of FPGA 50. In this particular example, an input/output interconnect tile (IOI tile) is used to couple an IOB tile to a CLB tile. Reference numeral 41 points to one such IOI tile. IOI tile 41 is disposed between an IOB tile 42 and a CLB tile 43.

Digital Signal Processors ("DSPs") are placed in tile area 45. A generally central tile area 46 may be used for support circuitry. The support circuitry may include, for example, DCMs, CCMs, IOBs, configuration logic 12, encryption/decryption logic, global clock driver circuitry, boundary scan circuitry and system monitor 20.

In this particular example, clock distribution circuitry is located in tile areas 48 and 52. Tile area 48 is for DCM clock distribution 64, IOB clock distribution 68 and H-tree row clock distribution 62, as well as FPGA "global" buffers ("BUFG") 56. Notably, H-tree clock distribution 40 may be disposed between columns of tiles. Tile area 52 is for FPGA "global" clock distribution 58. Multi-gigabit transceivers ("MGT") 24 may be located in tile area 54.

Additional details regarding FPGA 50 may be found in a co-pending U.S. patent application Ser. No. 10/683,944 entitled "Columnar Architecture", by Young, filed Oct. 10, 2003, previously incorporated by reference herein in its entirety.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. For example, a serial chain of registers for SDR and two serial chains of registers for DDR are provided from a set of reconfigurable logic, where same registers from a set of reconfigurable logic is used to respectively provide at least a portion of one of the serial chain of registers for SDR and the two serially chains of registers for DDR. However, the set of reconfigurable logic may be sufficiently large such that same flip-flops need not be used to provide the SDR and DDR serial chains. Claim(s) listing steps do not imply any order of the steps. Trademarks are the property of their respective owners. Additionally, the headings herein are for the convenience of the reader and are not intended to limit the scope of one or more aspects of the invention.

What is claimed is:

1. A bimodal serial to parallel converter, comprising:
    a first stage of registers clocked responsive to a first signal;
    first select circuitry coupled to the first stage of registers;
    a second stage of registers coupled to the select circuitry and clocked responsive a second signal;
    a third stage of registers clocked responsive to a third signal;
    the third signal having a lower frequency than the first signal;
    a first portion of the first stage of registers configured as a single shift register chain in a first mode of operation;
    a second portion of the first stage of registers configured as two shift registers in a second mode of operation;
    a bitslip controller coupled to receive the first signal and the third signal and configured to provide a clock control signal and an input select control signal;
    the first select circuitry coupled to receive the input select control signal and to select responsive to the input select control signal between at least two outputs of the first stage of registers to provide parallel input to the second stage of registers;
    second select circuitry coupled to receive the third signal and the clock control signal and configured to provide the second signal as being either one of the third signal and the clock control signal, the clock control signal being a divided down version of the first signal;
    the clock control signal being the second signal when in the second mode of operation; and
    the third signal being the second signal when in the first mode of operation.

2. The bimodal serial to parallel converter, according to claim 1, wherein the third signal is a divided down version of the first signal.

3. The bimodal serial to parallel converter, according to claim 1, wherein the first mode of operation is a single data rate mode, and wherein the second mode of operation is a double data rate mode.

4. The bimodal serial to parallel converter, according to claim 1, wherein the first select circuitry comprises a stage of multiplexers.

5. The bimodal serial to parallel converter, according to claim 4, wherein the input select control signal is fixed in the first mode of operation and toggled in the second mode of operation.

6. The bimodal serial to parallel converter, according to claim 5, wherein the second select circuitry comprises a multiplexer.

7. The bimodal serial to parallel converter, according to claim 6, wherein the bimodal serial to parallel converter is located in an input/output block of an integrated circuit.

8. The bimodal serial to parallel converter, according to claim 7, wherein the integrated circuit is a programmable logic device.

9. The bimodal serial to parallel converter, according to claim 8, wherein the programmable logic device is a Field Programmable Gate Array.

10. The bimodal serial to parallel converter, according to claim 1, wherein the bitslip controller comprises a counter.

11. The bimodal serial to parallel converter, according to claim 1, wherein the first portion of the first stage of registers and the second portion of the first stage of registers are provided from a set of reconfigurable logic, wherein the first portion and the second portion share at least part of the set of reconfigurable logic.

12. A method for reordering data, the method comprising:
    obtaining serial data to a first stage of registers, the first stage of registers apportioned into a first chain of registers and a second chain of registers;
    converting the serial data to parallel data with the first stage of registers responsive to a first clock signal, the serial data serially shifted into the first chain of registers on a positive edge of the first clock signal, the serial data serially shifted into the second chain of registers on a negative edge of the first clock signal;
    selecting a first portion of output of the first chain of registers and the second chain of registers to provide a first bitslip operation in a first direction, the selecting responsive to a control signal in a first state; and
    selecting a second portion of output of the first chain of registers and the second chain of registers to provide a second bitslip operation in a second direction, the selecting responsive to the control signal in a second state.

13. The method, according to claim 12, further comprising:
    selecting a second clock signal from clock signal inputs;
    transferring the first portion of output to a second stage of registers responsive to the second clock signal selected, the second clock signal having a lower frequency than the first clock signal; and
    transferring the second portion of output to the second stage of registers responsive to the second clock signal selected.

14. The method, according to claim 13, wherein the second clock signal is selected between a divided down version of the first clock signal and a bitslip clock signal, the first portion of the outputs being transferred responsive to the divided down version of the first clock signal, the second portion of the outputs being transferred responsive to the bitslip clock signal.

15. The method, according to claim 14, wherein the bitslip clock signal is another divided down version of the first clock signal and is generated in part responsive to a counter counting clock cycles of the first clock signal for periodically delaying the bitslip clock signal one clock cycle of the first clock signal.

16. The method, according to claim 15, wherein the bitslip clock signal is generated internally with respect to an input/output block of an integrated circuit.

17. The method, according to claim 16, wherein the integrated circuit is a programmable logic device.

18. The method, according to claim 13, wherein the transferring is done without changing contents of the first stage of registers.

19. The method, according to claim 12, wherein two bits of the serial data are shifted for a clock cycle of the first clock signal.

20. The method, according to claim 12, wherein the serial data is a training pattern.

21. The method, according to claim 20, where the training pattern is divided into a first sub-pattern for the first chain of registers and a second sub-pattern for the second chain of registers.

22. The method, according to claim 21, wherein the first sub-pattern and the second sub-pattern are each respectively shifted by the first chain of registers and the second chain of registers for a clock cycle of the first clock signal.

23. The method, according to claim 14, further comprising transferring parallel data output from the second stage of registers to a third stage of registers responsive to the divided down version of the first clock signal.

24. The method, according to claim 12, wherein the first direction is back one combination of data values, and wherein the second direction is forward three combinations of the data values.

25. The method, according to claim 14, wherein the serial data is provided at a Double Data Rate.

26. The method, according to claim 25, further comprising:
  changing the serial data from the Double Data Rate to a Single Data Rate;
  configuring the first stage of registers into a single serial chain of registers;
  converting the serial data to parallel data with the single serial chain of registers responsive to the first clock signal, the serial data serially shifted into the single serial chain of registers on either the positive edge or on the negative edge of the first clock signal;
  selecting output of the single serial chain of registers responsive to the control signal being in the first state; and
  transferring the output selected to the second stage of registers responsive to the divided down version of the first clock signal.

27. The method, according to claim 12, wherein the first chain of registers and the second chain of registers are configured from a set of reconfigurable logic responsive to a first mode of operation.

28. The method, according to claim 27, further comprising reconfiguring from the set of reconfigurable logic a third chain of registers responsive to second mode of operation.

29. The method, according to claim 28, wherein the first mode of operation and the second mode of operation respectively are a Double Data Rate mode and a Single Data Rate mode.

30. The method, according to claim 12, wherein the second chain of registers includes one more register than the first chain of registers.

31. The method, according to claim 30, wherein two registers of the second chain of registers store the same data value of the serial data.

* * * * *